United States Patent [19]
Nam et al.

[11] Patent Number: 6,021,141
[45] Date of Patent: *Feb. 1, 2000

[54] TUNABLE BLUE LASER DIODE

[75] Inventors: Derek W. Nam, Sunnyvale; David F. Welch, Menlo Park; Robert G. Waarts, Palo Alto; Jo S. Major, San Jose, all of Calif.

[73] Assignee: SDL, Inc., San Jose, Calif.

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/808,737

[22] Filed: Feb. 28, 1997

Related U.S. Application Data

[63] Continuation of application No. 08/625,781, Mar. 29, 1996, Pat. No. 5,644,584.

[51] Int. Cl.[7] ...................................................... H01S 3/10
[52] U.S. Cl. .................... 372/20; 372/22; 372/5; 372/102; 372/26; 372/64; 372/6; 372/92; 372/99; 372/34; 372/35; 372/96
[58] Field of Search ........................ 372/20, 22, 6, 372/34, 102, 92, 64, 26, 36, 75, 96, 5, 99

[56] References Cited

U.S. PATENT DOCUMENTS

| | | | |
|---|---|---|---|
| 4,479,224 | 10/1984 | Rediker | 372/92 |
| 4,485,474 | 11/1984 | Osterwalder | 372/28 |
| 4,783,788 | 11/1988 | Gordon | 372/102 |
| 4,808,291 | 2/1989 | Byer et al. | 372/34 |
| 4,847,851 | 7/1989 | Dixon | 372/75 |
| 5,036,220 | 7/1991 | Byer et al. | 372/22 |
| 5,181,214 | 1/1993 | Berger et al. | 372/34 |
| 5,185,752 | 2/1993 | Welch et al. | 372/22 |
| 5,187,714 | 2/1993 | Okazaki et al. | 372/36 |
| 5,222,088 | 6/1993 | Amano | 372/22 |
| 5,253,259 | 10/1993 | Yamamoto et al. | 372/22 |
| 5,253,322 | 10/1993 | Onishi et al. | 372/6 |
| 5,265,115 | 11/1993 | Amano | 372/36 |
| 5,267,252 | 11/1993 | Amano | 372/36 |
| 5,303,247 | 4/1994 | Yamamoto et al. | 372/22 |
| 5,303,250 | 4/1994 | Masuda et al. | 372/21 |
| 5,319,652 | 6/1994 | Moeller et al. | 372/6 |
| 5,341,388 | 8/1994 | Masuda et al. | 372/36 |
| 5,363,390 | 11/1994 | Yang et al. | 372/21 |
| 5,379,311 | 1/1995 | McFarlane | 372/41 |
| 5,384,797 | 1/1995 | Welch et al. | 372/23 |
| 5,384,799 | 1/1995 | Osterwalder | 372/32 |
| 5,386,426 | 1/1995 | Stephens | 372/20 |
| 5,390,210 | 2/1995 | Fouquet et al. | 372/21 |
| 5,412,672 | 5/1995 | Ainsle et al. | 372/6 |
| 5,452,312 | 9/1995 | Yamamoto et al. | 372/22 |
| 5,644,584 | 7/1997 | Nam et al. | 372/20 |

OTHER PUBLICATIONS

J.T. Lin, Lasers and Optronics, Dec. 1990, pp. 34–40.

*Primary Examiner*—Leon Scott, Jr.

[57] ABSTRACT

A harmonic generator laser system which features a distributed Bragg reflector (DBR) or distributed feedback (DFB) tunable diode laser coupled to a quasi-phase matched (QPM) waveguide of optically nonlinear material. Tuning of the DBR laser may be achieved either thermally or via current injection, or both, halving the wavelength of a red laser into the visible blue spectral band. Thermal tuning may provide a coarse tuning adjustment, while injected current may provide fine tuning accessible to a user. Separately or in combination with current tuning, a modulation signal may be applied to the DBR laser for achieving an intensity modulated or a pulsed output. In another embodiment, modulation may be achieved by frequency modulation of the laser. A very compact tunable blue laser is formed. In yet another embodiment a double clad fiber amplifier is disposed between the tunable laser and the waveguide. The fiber amplifier is pumped by a high power laser, while the core guides light to be frequency doubled in the nonlinear material from a continuously tunable laser.

42 Claims, 6 Drawing Sheets

TUNABLE BLUE LASER DIODE

This application is a continuation of application Ser. No. 08/625,781 filed Mar. 3, 1996 which application is now U.S. Pat. No. 5,644,584.

TECHNICAL FIELD

The present invention relates to semiconductor diode lasers whose red or near infrared light emission is converted to ultraviolet, blue or green laser light by means of a nonlinear optical device.

BACKGROUND ART

Short wavelength (ultraviolet, blue, green) coherent light sources are desirable for a number of applications, including high density ($\approx 1$ Gbit/cm$^2$) optical data storage, color image processing, such as in laser printers, submicron lithography and other high resolution laser processing steps for fabricating VLSI devices, satellite-to-submarine and other underwater optical communications, and spectroscopy and other optical measurements, such as interferometric gravity-wave detection and the like. In many of these applications, compact laser systems are desired, and in some, relatively high output powers (greater than about 100 mW) are required. Accordingly, considerable effort has been undertaken in recent years to develop more compact, short-wavelength coherent light sources to replace the low-power air-cooled gas lasers, such as argon ion and helium-cadmium lasers, that are presently the only practical sources which are available.

Because of their compactness, high electrical-to-optical conversion efficiency, wavelength tunability and rapid modulation capabilities, semiconductor laser diodes are being actively studied to discover whether shorter wavelengths can be generated. At present, AlGaInP lasers have the shortest practical limit of wavelength around 600 nm (yellow-orange). Potential wide band-gap semiconductor lasers made of AlGaN or other materials are being studied. At present, approaches to directly generating mid-infrared wavelengths are focused on rare-earth doped solid state lasers, such as thulium (Tm) and holmium (Ho) doped lasers.

Nonlinear optical processes, such as frequency doubling, also called second harmonic generation, and sum frequency mixing, are capable of converting red and near infrared light into ultraviolet, blue and green light. Accordingly, much development work has focused on using nonlinear frequency conversion techniques to generate ultraviolet, blue and green light directly from red and near infrared laser diodes. Direct frequency doubling of laser diode emission makes possible the extension of available diode laser wavelengths into the ultraviolet, blue and green regions of the spectrum, and represents at present the most feasible approach to developing a compact, efficient, high power coherent source in those spectral regions. However, in order for this approach to be successful and useful in practical applications, like those mentioned above, higher optical conversion efficiencies from the red and near infrared laser diode wavelengths to the desired ultraviolet, blue and green wavelengths are needed.

In general, higher optical conversion efficiencies are associated with a higher power density or intensity of the fundamental pump wavelength within the nonlinear optical material. Because of the relatively low powers available from most diode lasers, configurations using external resonators or channel waveguide structures have been preferred. For example, efficient frequency conversion is possible by coupling laser diode radiation into a passive external resonator of either a standing wave or unidirectional ring type that contains a bulk crystal of nonlinear optical material, such as potassium titanyl phosphate (KTiOPO$_4$) or potassium niobate (KNbO$_3$). The high circulating intensity that builds up in the crystal located within the resonator results in efficient frequency conversion of the laser diode radiation.

W. J. Kozlovsky, et al., in *Applied Physics Letters* 56(23), pages 2291–2292 (1990), describe frequency doubling of an 856 nm laser output from a ridge waveguide, single quantum well, graded index double heterostructure GaAlAs diode laser in a monolithic KNbO$_3$ crystal ring resonator in order to generate 428 nm (blue) radiation. The ring resonator is a 7 mm long KNbO$_3$ crystal with curved mirror end faces coated for high reflectivity at the fundamental wavelength and transitivity of the frequency doubled blue light and with a flat total internal reflection surface parallel to the mirror axes. The crystal resonator is placed on a thermoelectric cooler so that the temperature can be stabilized at 15° C. for phase-matched second harmonic generation along the long direction of the ring path. In order to achieve efficient power buildup in the KNbO$_3$ cavity and generation of stable blue output, the laser output frequency is locked to the cavity resonance using an elaborate electronic servo technique that superimposes a small RF current on the dc injection current to produce weak FM sidebands in the laser output and that uses a double-balanced mixer for phase sensitive detection of the optical-heterodyne-spectroscopy signal in the light reflected from the input surface of the resonator. Such a signal is zero when the carrier frequency coincides with the cavity resonance. The output signal of the mixer is amplified and coupled back to the laser injection current, so that the diode laser's output frequency tracks the resonance frequency of the KNbO$_3$ cavity. Using such a servo technique, a 41 mW blue output (39% optical conversion frequency) was achieved. However, the technique requires a significant amount of electronics for it to work properly without amplitude noise. Elaborate temperature and electronic feedback controls for matching resonance frequencies are typical of external resonator systems. Besides being expensive and not very compact, in attempting to maintain stable operation, they usually introduce some wavelength jitter into the system.

J. T. Lin, in *Lasers and Optronics*, December 1990, pages 34–40, describes diode-pumped self-frequency-doubling (SFD) lasers using Nd$_x$Y$_{1-x}$Al$_3$(BO$_3$)$_4$ (NYAB) crystals for the frequency doubling, and compares them against prior single-pass KTP, external resonator KNbO$_3$ and channel waveguide LiNbO$_3$ second harmonic generator configurations for diode lasers, as well as other frequency doubled laser systems. Up to 80 mW of output power (up to 8.0% efficiency) at 531 nm is achieved with NYAB compared to 40 mW of output power at 430 nm for external-resonator-type second harmonic generation of a 860 nm diode laser beam. Like diode-pumped solid-state lasers, these SFD laser systems are not particularly compact, so that a tradeoff between compactness and greater conversion efficiency must be made.

In U.S. Pat. No. 5,222,088 S. Amano discloses a blue laser formed by a semiconductor laser generating an excitation beam which is doubled by a crystal within a laser cavity. The second harmonic within the cavity is the desired wavelength. A cooling device is mounted on the frequency doubling crystal which stabilizes the frequency of the output beam.

In U.S. Pat. No. 4,809,291 Byer et al. disclose a diode laser which pumps neodymium lasing material within a laser cavity. The output of the neodymium material is doubled with a frequency doubling crystal and the output of the cavity is blue light having a wavelength of approximately 0.473 microns. Both the neodymium lasing material and the frequency doubling crystal are temperature stabilized with cooling elements.

Another approach for efficient frequency conversion is to use ion-diffused channel waveguides of nonlinear optical material, such as lithium niobate ($LiNbO_3$) or potassium titanyl phosphate ($KTiOPO_4$), to double the frequency of the laser diode emission. Doubling is relatively efficient if the waveguide is relatively long (greater than about 1 mm), but phase-matching of long frequency-doubling waveguides is critical, the available wavelength range is more limited, and fabrication tolerances are tight. Periodic poling can ease such requirements and increase efficiency. Another problem that arises when waveguide systems are used is that it is difficult to collimate and then focus the diode laser light to a diffraction-limited spot for efficient coupling into the waveguide, using conventional spherical lens systems. However, waveguide systems are compact.

C. J. Van der Poel, et al., in *Applied Physics Letters* 57(20), pages 2074–2076 (1990), describe second harmonic generation in periodically segmented $KTiOPO_4$ (KTP) waveguide structures. The waveguide structures are formed in either flux-grown or hydrothermally grown KTP substrates by ion exchange through a Ti mask using various Rb/Tl/Ba nitrate molten salt baths. There are two segments per period, one segment being bulk KTP with a length $l_1$ and a propagation constant mismatch $\Delta k_1$, the other segment being an ion-exchanged KTP waveguide with a length $l_2$ and a propagation constant mismatch $\Delta k_2$, in which the phase-matching condition $\Delta k_1 l_1 + \Delta k_2 l_2 = 2\pi M$ is met (M being an integer). Ferroelectric domain reversals in adjacent segments can also be included for higher conversion efficiencies. Efficient second harmonic outputs were observed from 0.38 μm (deep purple) to 0.48 μm (blue-green). W. P. Risk, in *Applied Physics Letters* 58 (1), pages 19–21 (1991), describes fabrication of optical waveguides in KTP crystals by an ion-exchange process involving a molten Rb/Ba nitrate bath. Second harmonic generation from titanium:sapphire laser light in the 900–1000 nm range was observed.

W. J. Kozlovsky et al., in *Applied Physics Letters* 58(23), pages 2291–2292 (1990) describe second harmonic generation of 428 nm (blue) light from an 856-nm current tuned laser coupled into a $KNbO_3$ nonlinear, phase matched ring-resonator crystal. The crystal is mounted on a thermoelectric cooler for temperature control and stability. A closed loop servo technique is disclosed for locking a laser diode to the crystal.

A. Harada et al., in *Applied Physics Letters* 59(13), pages 1535–1537 (1991), describe second harmonic generation of 442 nm (blue) light from an 884-nm semiconductor laser using an organic crystal-cored nonlinear optical fiber coupled to the laser. The single transverse mode fundamental beam of the diode laser is collimated by a first objective lens and an anamorphic prism pair, and then focused into the fiber by a second objective lens. The fiber was formed by filling a hollow glass fiber by capillary action with the organic material (DMNP) melt, and then recrystallizing the polycrystals thus obtained by the BridgmanStockberger single crystal formation method in which the fiber is pulled out of a 105° C. furnace. The fiber core diameter and length are 1.4 μm and 5–15 mm, respectively. Output powers of 0.16 mW (about 1.6% conversion efficiency) were achieved. G. L. J. A. Rikken, et al., in *Applied Physics Letters* 58(5), pages 435–437 (1991), describe nonlinear optical effects in side chain copolymers with methylmethacrylate.

Efficient frequency conversion also requires good spectral mode properties of the diode lasers. In general, the laser wavelength needs to be stabilized to within 10 nm of the optimum wavelength for frequency doubling. The diode source must meet these wavelength specifications in the presence of feedback and temperature variations. Distributed Bragg reflector (DBR) lasers and distributed feedback (DFB) lasers use a grating to provide feedback and are known to have increased spectral and temperature stability compared to other laser diode sources.

An object of the invention is to provide an efficient, short wavelength (ultraviolet, blue or green), compact laser source.

SUMMARY OF THE INVENTION

The object has been met with a distributed Bragg reflector (DBR) or distributed feedback (DFB) monolithic diode laser coupled to a frequency doubling crystal which is a quasi-phase matched (QPM) optically nonlinear waveguide. DBR and DFB lasers emit predominantly in a single longitudinal mode. These lasers are discussed in Chapter 7 of the book "Long-Wavelength Semiconductor Lasers" by G. P. Agrawal and N. K. Dutta. Both types of lasers include grating regions from which feedback is derived. The DBR or DFB laser is tunable, preferably over at least 20 nanometers, by temperature or current injection affecting the index of refraction in the active region, particularly grating regions, allowing wavelength selection over a limited band. The optimum laser wavelength for frequency doubling may be established at the time of manufacture, by fixing the length of the QPM waveguide or by fixing the periodicity of any domain reversals in the waveguide, while wavelength tuning in the neighborhood of the optimum wavelength may be left to a user by allowing temperature or current control of the laser. The optimum wavelength may also be tuned by means of temperature control, such as a thermoelectric cooler or heater, and thus thermal expansion control, of the waveguide. Coarse tuning may be provided at the time of manufacture and fine tuning provided for a user. The QPM waveguide is phase matched to the laser and both the laser and the waveguide may be temperature controlled for tuning, frequency stability and modulation purposes. The output beam from the waveguide is collimated with an output lens and presents a stable output beam with typical output powers of 100 to 200 mW. By using a monolithic DFB or DBR diode laser and QPM waveguide combination an extremely compact tunable blue laser may be fabricated. Temperature and current injection tuning greatly simplify operation and construction in comparison to lasers where external feedback and beam sampling optics limit the ability to construct a compact device.

DETAILED DESCRIPTION OF THE PREFERRED EMBODIMENTS

Figure 1:
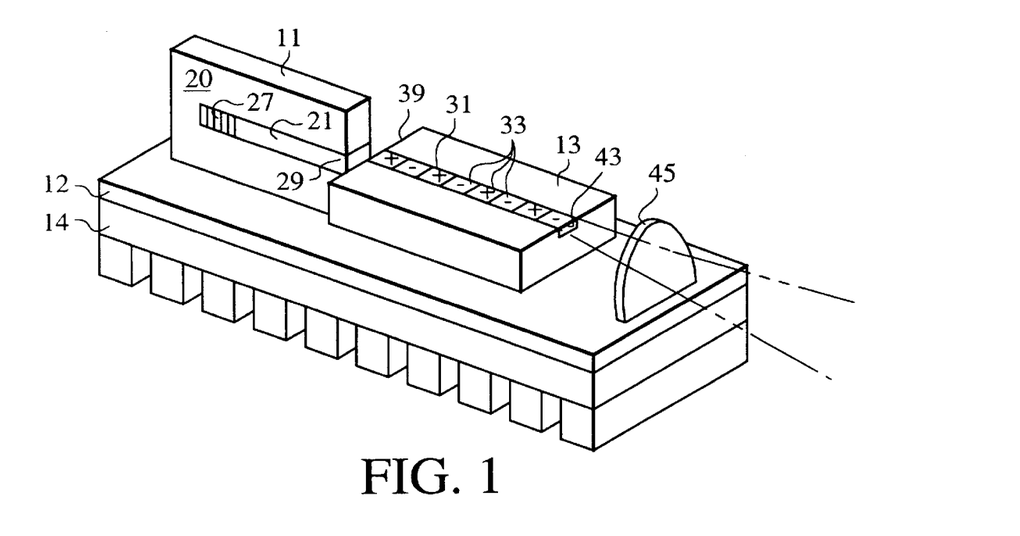
FIG. 1 is a perspective plan view of a frequency-doubled laser in accord with the present invention.

With reference to FIG. 1, a frequency-doubled diode laser of the present invention features a single mode laser diode 11 which is coupled to a second-harmonic generator 13, which is a nonlinear crystal providing a waveguide 31 for receiving the coherent light output of the laser 11 and producing an output at a fractional harmonic wavelength of the laser light. Both the laser 11 and the harmonic generator 13 are mounted on a substrate 12, which has an underside mounted to a thermoelectric cooler 14, such as a Peltier device. Such devices are known for temperature control of laser devices. See, for example, U.S. Pat. No. 5,267,252 to Amano and U.S. Pat. No. 5,222,088 to Amano. The cooler may incorporate microchannels in an adjacent structure 15 for greater 15 thermal capacity. The action of the cooler and the microchannels is coordinated using temperature sensors with feedback control. The thermoelectric device 14 may be used to tune the frequency of laser 11 to select the desired output wavelength, as well as to stabilize the wavelength output of the beam.

A DBR laser 11, typically having an output wavelength longer than 650 nanometers, has gratings 27 formed at the rearward end of waveguide 21. The DBR grating 27 is formed by holographically exposing and selectively removing a mask, then etching the exposed portions of the top major surface of the body 20 over at least the end of the waveguide 21. The grating period is selected to reflect a desired fundamental wave. A first-order grating is preferred. The use of the distributed Bragg reflector grating 27 selects the wavelength of the laser diode output beam and stabilizes the output at a wavelength that preferably matches the peak frequency-conversion efficiency of the harmonic generator 13. As an alternative to a DBR laser, a DFB laser can be used.

Regardless of whether the harmonic generator 13 is obtained commercially and etched to form a grating, or made by a user, the manner in which the nonlinear material is polarized typically dictates that the laser diode output beam be TE polarized when coupled through the front facet 29 into the harmonic generator 13 in order for the nonlinear interaction to be optimized. The harmonic generator 13 is turned 90° relative to the laser to launch the diode's polarized TE mode of propagation into the waveguide.

Present laser diodes in the infra red are typically running in a TE mode and poled nonlinear waveguides are typically guiding only the TM mode. However, laser diodes may also be fabricated with TM mode operation by, for example, using tensile strained active layers or nonlinear waveguides can be fabricated, in principle, that operate in a TE mode. In either case it would then not be necessary to rotate the nonlinear waveguide by 90 degrees with respect to the laser diode. Such a non-rotated configuration could result in lower coupling losses between the laser diode and the nonlinear waveguide. In addition, multiple laser diodes and waveguides can be fabricated on the same chip and coupled in parallel when the laser mode orientation matches that of the waveguide. The aspect ratio of the laser diode output beam (typically about 3:1) is sized to match the input face 39 of the waveguide 31. A 3 $\mu$m×3 $\mu$m waveguide 31 (aspect ratio 1:1) can be matched to a 3 $\mu$m×1 $\mu$m beam waist (aspect ratio 3:1) of the laser diode 11 with a microlens, such as a fiber lens. The DBR laser 11 and the harmonic generator 13 have optical axes which must be carefully aligned for optimal coupling of laser light to the waveguide of harmonic generator 13. In construction, first the harmonic generator 13 is mounted to substrate 12 and then laser 11 is manually adjusted to find the maximum power output or is automatically adjusted by a servo system, described below. The substrate may be grooved or marked by etching to indicate approximate locations for the components. An output lens 45 is mounted on the substrate to form the desired beam shape.

The preferred harmonic generator 13 is a periodically-poled frequency-doubling waveguide device of the quasi-phase matched type (QPM). These harmonic generators are commercially available or may be formed from a nonlinear material, such as a ferroelectric crystalline body of $LiNbO_3$, $LiTaO_3$ or KTP. The "c-axis" of the crystal is generally oriented perpendicular to the top major surface of the body in which the waveguide will be formed, and thus also perpendicular to that waveguide 31. The QPM device is tuned to generate a fractional harmonic wavelength of the DBR laser, generally in the wavelength region below 520 nanometers.

The waveguide 31, in the form of a central channel in the top major surface of the body extending along the length of the body from front end 39 to exit end 43, is made by the exchange of protons ($H^+$) with lithium ions in the $LiNbO_3$ or $LiTaO_3$ material. The waveguide can also be fabricated by the diffusion of barium into KTP crystals. For example, the proton exchange may be performed by immersing the crystal in a weak, non-etching acid, such as benzoic acid, at an elevated temperature of 200° C., using a photolithographically-defined mask with a central stripe opening corresponding to the desired channel location to limit contact of the acid to the stripe region of the surface. The resulting diffusion of protons ($H^+$) increases the refractive index of the material slightly, creating a waveguide 31. For example, in the aforementioned U.S. Pat. No. 5,036,220 to Byer et al., a refractive index increase of 0.003 is obtained. The proton exchanged waveguide also has a slightly reduced nonlinear coefficient, so that an optimum balance is reached when the $H^+$ concentration is sufficiently high to create a waveguide that will maintain the received light intensity from the diode output, yet not so high that the nonlinear coefficient needed to provide efficient frequency doubling is significantly reduced. A 5–10% conversion efficiency is typical for the refractive index increase obtained by Byer et al. Other types of waveguides, such as the ridge type waveguide in the aforementioned U.S. Pat. No. 4,973,117 to Yamada can also be used. The waveguide 31 is a single transverse mode waveguide, at least at the fundamental frequency of light received from the DBR laser diode 11, which is emitting a TM mode into the waveguide.

In order to form the ferroelectric polarization domains of a periodically-poled waveguide, electrodes are patterned on the surface of the body 13, at least in areas that will interact with light propagating in the waveguide 31. For example, the electrodes may be formed above the waveguide channel region 31 or immediately adjacent the sides of the waveguide 31 or both. They may even extend laterally across the entire width of the body 13. However, only the areas that will interact with the light from the laser diode 11 are significant. An electric field is applied by the electrodes to the ferroelectric crystal body 13, with the electrodes alternating spatially between more positive and more negative potentials, while the temperature of the body 13 is raised above the Curie temperature. Heating the body to 500–600° C. is typical. This orients the molecules of the crystal lattice so that regions or domains 33 of alternating dominant polarizations are obtained. The body 13 is cooled below the Curie temperature of the material while the electrode bias is maintained. An electrode pattern that couples opposing fields in adjacent regions 33 is preferred over simple on-off fields in order to minimize any uncertainty in the domain boundaries. The polarizations of the various domains 33 are represented by "+" and "−" signs in FIG. 1. The polarizations can extend laterally outside of the waveguide 31. The domains 33 have lengths selected to provide first-order quasi-phasematching or third-order quasi-phasematching for the desired nonlinear coefficient and wavelength, as discussed in the aforementioned Byer et al patent. These lengths are related to the coherence length between free and forced second-harmonic waves resulting from the refractive index difference between the fundamental and free second-harmonic waves propagating in the waveguide 31. Hence, periodic poling establishes an optimum wavelength for frequency doubling. A domain length L on the order of 2–5 µm is typical.

In the processing of the frequency converting waveguide the resonant frequency of the waveguide can be modified using in-process annealing. As the waveguides are processed in wafer form, the frequency conversion resonance can be monitored via prism coupling through the wafer surface. The resonant frequency is established and checked relative to the goal resonant frequency. In order to match the measured value to the desired resonant frequency the wafer can be annealed in an oven at a temperature between 250° C. and 450° C. The additional anneal increases the effective mode size of the waveguide thus changing the effective index of refraction, and the resonance condition. The resonant wavelength shifts to a shorter wavelength. As a result of the ability to tune the resonant condition in wafer form, frequency conversion waveguides can be fabricated to exactly match the emission from the laser diodes.

The resonant condition of the frequency selective laser diode can be fabricated such that the temperature tuning of the laser diode matches that of the temperature tuning of the resonant condition of the frequency conversion waveguide. Normal DBR and Fabry-Perot lasers tune the resonant band at approximately 0.07 nm/° C. while the frequency conversion waveguides tune the resonant band at approximately 0.05 nm/° C. The tuning rate of the diode laser is governed by the change of the index of refraction with temperature of the semiconductor material. In order to equate the two temperature tuning rates a portion of the semiconductor material can be coated with a dielectric material which exhibits a lower index of refraction change with temperature. For instance a DBR laser diode can be coated with $SiO_2$ such that the $SiO_2$ interacts with the guided wave and the effective index of refraction and its change with temperature are modified by the presence of the $SiO_2$. Coatings can be selectively applied by semiconductor processing techniques of masking, etching and the like. With approximate thickness of $SiO_2$ over the grating region of a DBR laser the temperature tuning characteristics of the emission spectrum can be fabricated to exactly match that of the frequency conversion waveguide. As a result, the necessity for temperature control on the coupled device is eliminated.

Figure 2:
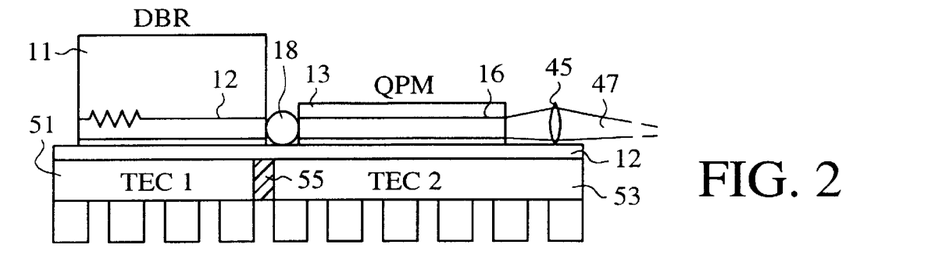
FIG. 2 is a side plan view of a first alternate embodiment of the apparatus of FIG. 1.

With reference to FIG. 2, DBR laser 11 is shown to have its waveguide region 12 optically coupled to the waveguide region 16 of the QPM waveguide 13 by means of an optical fiber or lens 18. Light from the DBR laser 11, typically having a wavelength longer than 0.62 microns is coupled into the nonlinear crystal which forms the QPM waveguide 13, where the wavelength is halved to a wavelength of 0.52 to 0.40 microns. Divergent output light from the QPM is collected by output lens 45 which produces a collimated beam 47. The laser and waveguide are mounted on the thermally conducting substrate 12.

In FIG. 2, separate thermal electric cooling elements are used to optimize stability and tuning. A first thermoelectric cooler 51 is associated with laser 11. A second thermoelectric cooler 53, spaced apart from the first cooler 51, is associated with the QPM waveguide 13. Each cooler is in contact with a mounting substrate directly below a respective optical component, with a thermally insulative material 55 therebetween. Cooler 53 is used primarily to stabilize the wavelength of waveguide 13. It could also be used to adjust the established optimum wavelength for frequency doubling by using thermal expansion or contraction of the waveguide material to change the domain lengths. Thermoelectric cooler 51 is used both for stabilizing laser 11, as well as for tuning purposes, during operation of the device.

Figure 2A:
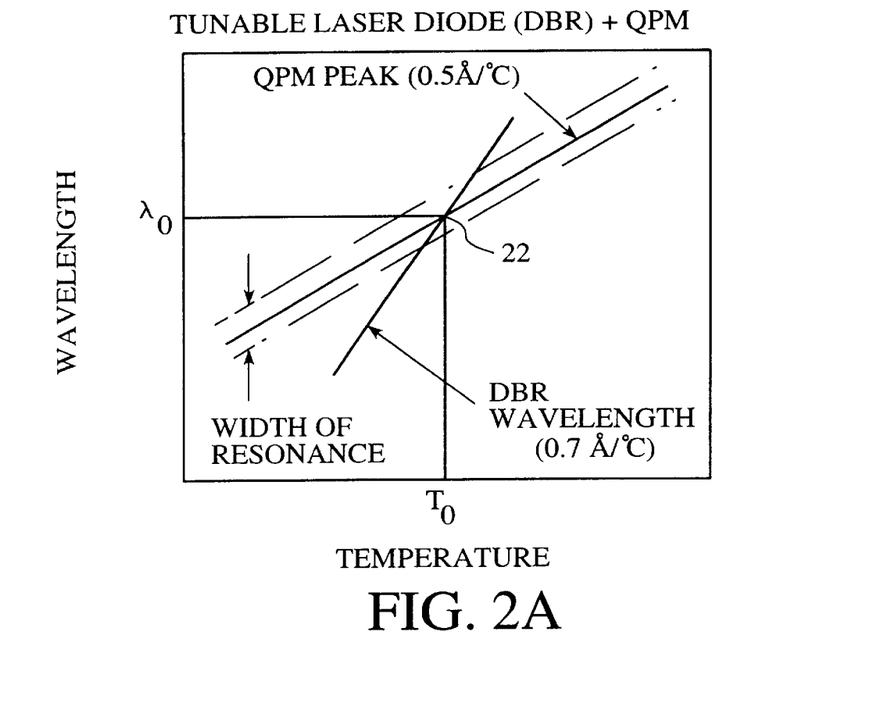
FIGS. 2A and 2B are plots showing temperature versus wavelength for frequency doubled lasers in accord with the present invention.
Figure 2B:
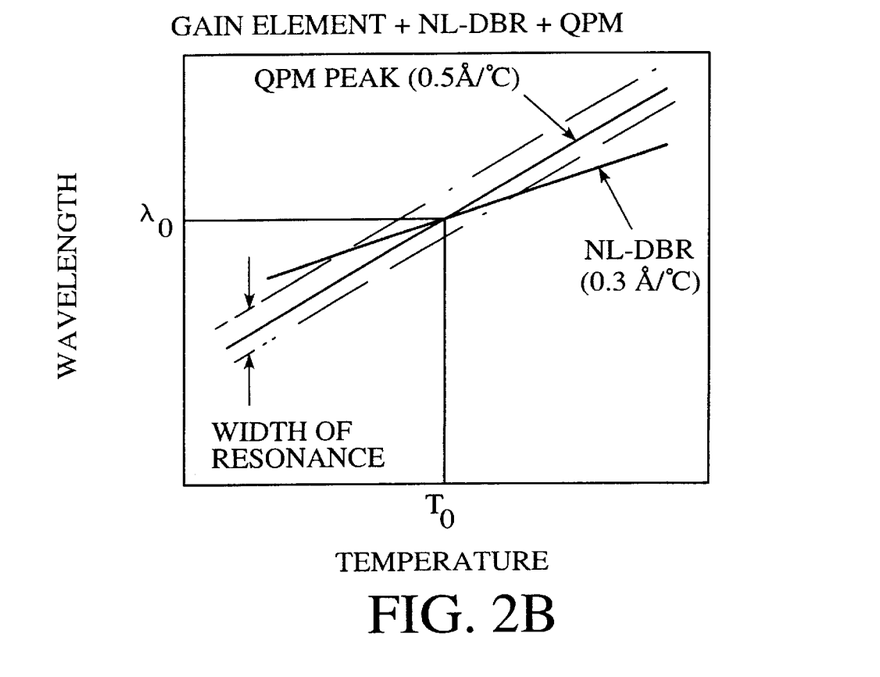

With reference to FIGS. 2A and 2B, examples of establishing an optimum waveguide for frequency doubling are shown. In FIG. 2A, the temperature dependence for the resident wavelength of a DBR device is shown to be a curve with a slope of 0.7 Å/° C. while the temperature versus wavelength dependence of the QPM device is shown to be a curve with a slope of 0.5 Å/° C. The two curves cross at 22 defining a wavelength $\lambda_0$ which is a resonant wavelength in both the laser and the QPM device. This optimum wavelength exists at a temperature $T_0$ which is maintained by thermoelectric cooling elements. In FIG. 2B once again, a curve for a QPM device is shown. However, this time the curve is crossed by a combined DBR device in combination with a nonlinear element.

During manufacture of the device, frequency stabilization can be achieved by several methods including monolithically integrated gratings for feedback or integrated etalons for greater frequency selectivity relative to Fabry-Perot lasers. The internal etalons can be fabricated through the incorporation of additional mirror surfaces in the cavity such that multiple Fabry-Perot cavities coexist in the laser resonator and the additive effects of the cavity resonances adds to the frequency selectivity of the laser diode.

Figure 3:
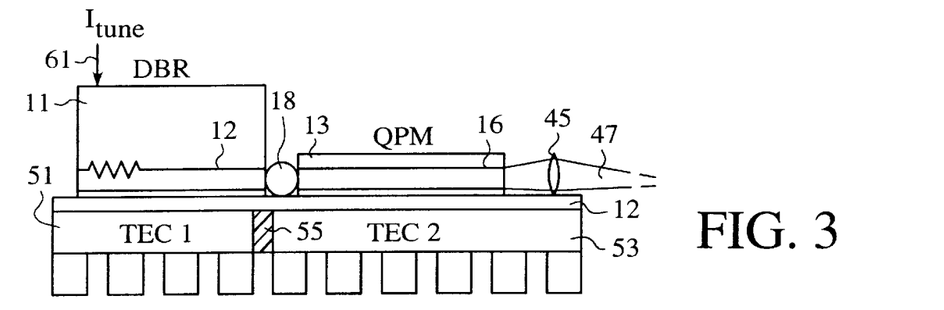
FIG. 3 is a side plan view of a second alternate embodiment of the apparatus of FIG. 1.

In FIG. 3, the same elements as in FIG. 2 may be seen, but in addition, a current injection port 61 is added for injecting current to the DBR laser for fine tuning. Coarse tuning of the laser may be achieved as shown in FIG. 2, but now the current injection port 61 is accessible to a user so that wavelength shifts over a small bandwidth, approximately a few nanometers may be achieved.

Figure 4:
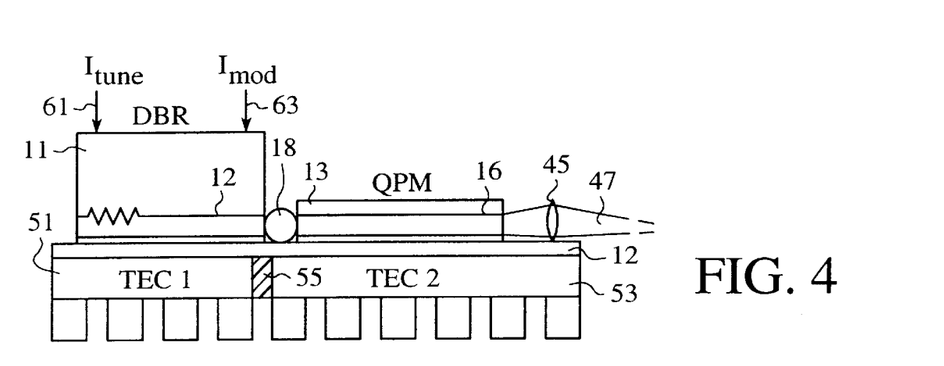
FIG. 4 is a side plan view of a third alternate embodiment of the apparatus of FIG. 1.

In FIG. 4, a modulation current 63 is applied to the laser 11. Although the modulation signal may be superimposed on the tuning current 61, the modulation signal may be independent and in fact, the tuning current is not needed, as in the embodiment of FIG. 2. The modulation current 63 allows a pulsed output to be achieved in the beam 47.

Figure 5:
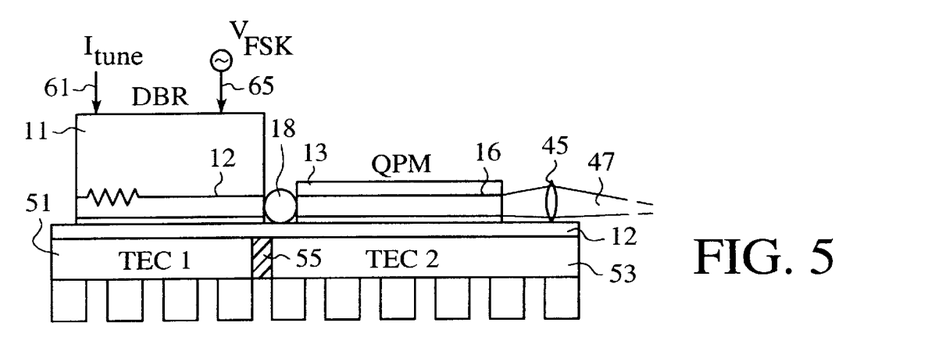
FIG. 5 is a side plan view of a fourth alternate embodiment of the apparatus of FIG. 1.

With reference to FIG. 5, instead of injecting modulation current, modulation may be achieved by variations in frequency of the laser. Shifts in frequency of the laser, caused by frequency shifting of the beam by an applied signal, i.e. FSK, indicated schematically by arrow 65, will change the output frequency and power of the beam. The frequency separation between two frequencies $f_1$ and $f_2$ used for "mark" and "space" FSK frequencies should be sufficient that a detector can readily separate the two. Once again, the modulation modes of FIGS. 4 and 5 are accessible to a user, together with the optional current tuning port 61.

Figure 6A:
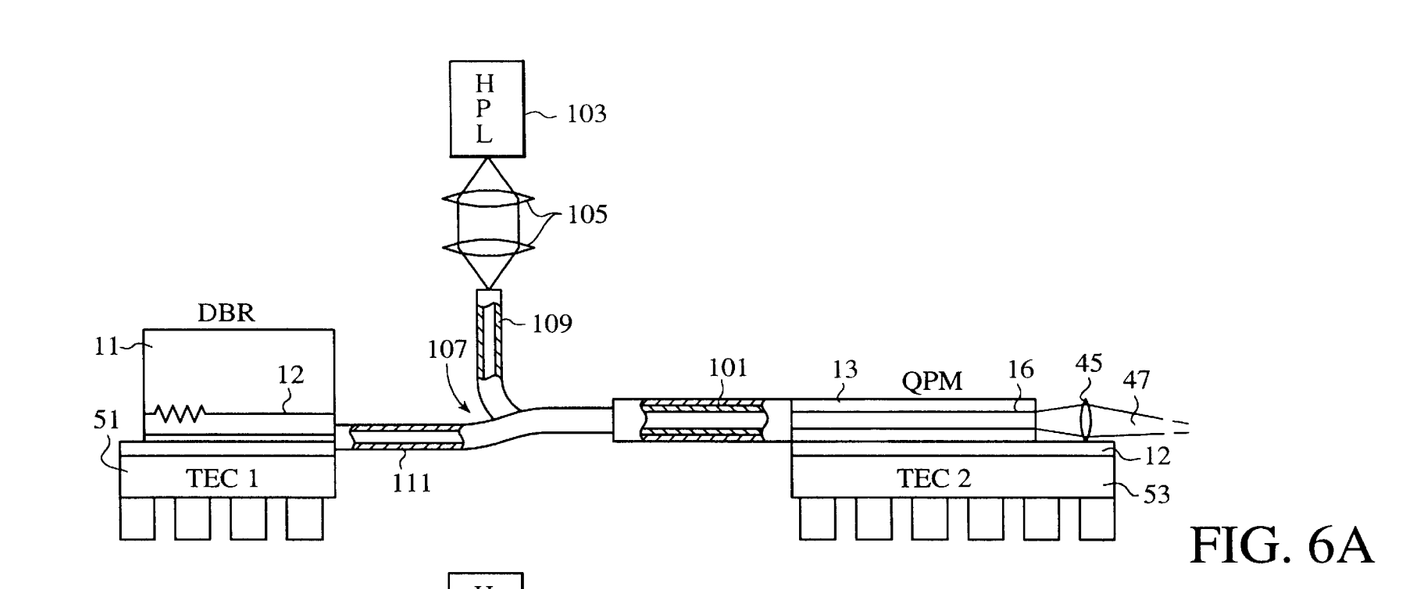
FIGS. 6A, 6B and 6C are side plan views of a fourth alternate embodiment of the apparatus of FIG. 1.
Figure 6B:
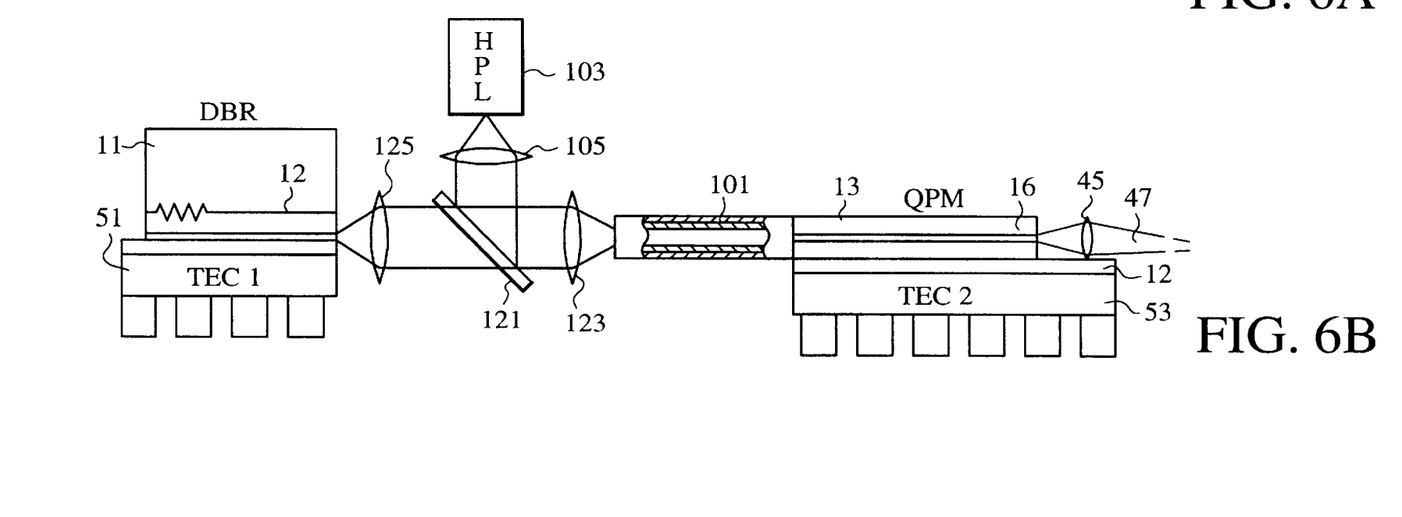

With reference to FIGS. 6A and 6B, the laser 11 and waveguide 13 are spaced apart, allowing a double clad fiber amplifier 101 to be interposed between the laser and the waveguide. The double clad fiber is pumped with a high power laser (HPL) pump 103 having a nominal output power of 10 watts. Laser 103 may be a neodymium-YAG laser or a diode laser having a wavelength appropriate for pumping fiber amplifier 101. In FIG. 6A, the light from laser 103 is fed through focusing optics 105 into the Y-junction distribution fiber 107 which has branches 109 and 111. Branch 109 has a multimode core receiving pump light from the optics 105. A typical pumping wavelength is 805 nm, while a typical wavelength of laser 11 for doubling is 946 nm, both lasers being diode lasers. The high power laser may have a 200–400 micron output beam derived from a one cm. bar array, emitting at 808 nm. A commercial laser having this characteristic is SDL-3400, P5 series. Branch 111 has a single mode core receiving light to be amplified from DBR laser 11. The two branches are heat treated and twisted. Light from branch 109 is fed to the inner cladding of fiber 101 while light from branch 111 is fed to the central core of the double clad fiber. The length of the double clad fiber 101 should ideally supply pump power of the laser 103 to the fiber core over the entire length of the fiber. A dichroic mirror, responsive to the wavelength of the pump light can be placed at the end of the double clad fiber 101 to reflect any remaining pump light back into the double clad fiber 101. In FIG. 6B, the light from laser 103 is fed through focusing optics 105 to a dichroic beamsplitter 121 which reflects the beam from laser 103 toward lens 123 and fiber amplifier 101. A lens 125 focuses light from DBR laser 11 through beamsplitter 121 and lens 123 into the core of fiber 101. A polarizing beamsplitter can be used as an alternative to a dichroic beamsplitter. Since the output of DBR laser is polarized, the double clad fiber 101 must be arranged in a manner which preserves TE mode polarization. This precludes a large amount of bending. A rectangular core cross-section preserves polarization best, although elliptical core fibers could also be used. The light beam directed into waveguide 13 should be polarized, as previously explained. Fiber 101 may be any double clad fiber which will amplify light in the core. Typically, rare earth doped single mode cores create gain, allowing the output of DBR laser 11 to be amplified to several watts before entering the waveguide 13. Because of increased amounts of power entering waveguide 13, the thermoelectric device 53 should have adequate cooling capacity for maintaining a stable frequency.

Figure 6C:
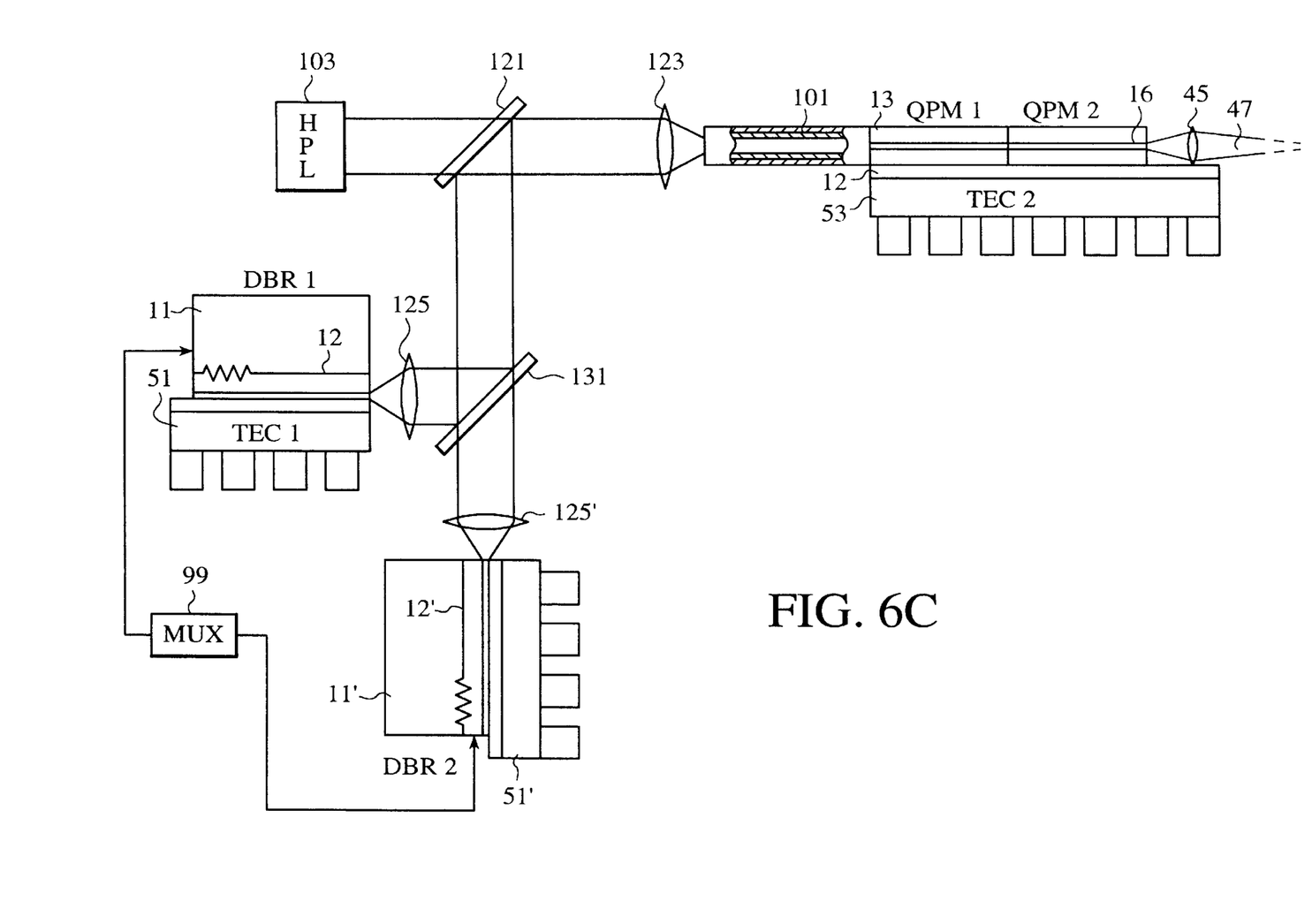

In FIG. 6C, two DBR lasers 11 and 11' are multiplexed via beamsplitter 131 so that two different wavelengths can be doubled using a single double clad fiber amplifier 101. A time division multiplexer 99 controls DBR 1 and DBR 2 so that one wavelength then the other, alternately, proceeds to beamsplitter 121 and entry to the fiber amplifier 101. All of the elements of DBR 2 correspond to similar elements of DBR 1.

For example, one DBR laser in the range 930–940 nm can be frequency-doubled to the blue and the other laser having a frequency in the range of 1050–1080 nm can be frequency-doubled to the green. This can be done with a Nd doped double clad fiber amplifier. Alternatively using a Yb doped fiber amplifier pumped at around 920 nm, a 970 nm wavelength may be doubled to the blue and a 1050–1150 nm wavelength may be doubled to the green. Such a dual wavelength arrangement is useful in display applications where field sequential operation is required. At the output end of the double clad fiber amplifier there are two nonlinear waveguide sections, labeled QPM 1 and QPM 2, each being optimized for doubling a particular wavelength. The QPM waveguide 13 has tandem sections QPM1 and QPM2, each optimized in the length of phase reversed regions for one of the two wavelengths to be doubled. The sections are about equal in length and share the same thermoelectric cooler 53.

Figure 6D:
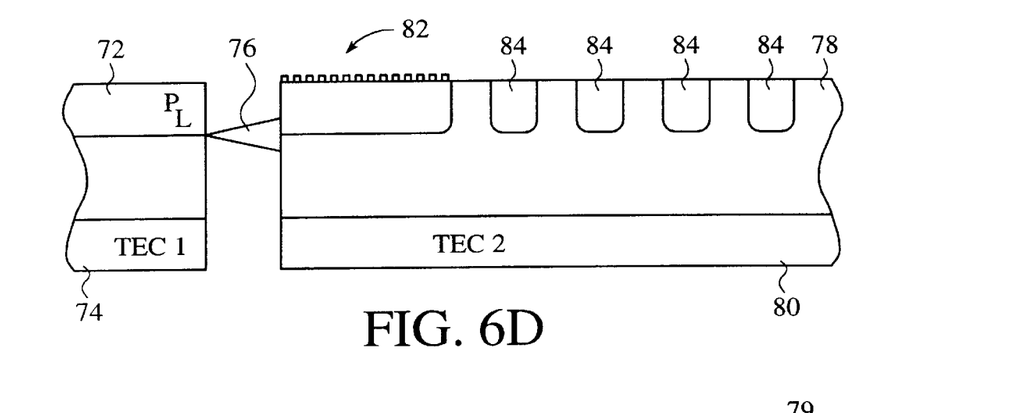
FIG. 6D is a side plan view of an infrared laser diode butt-coupled to a non-linear QPM waveguide with a feedback structure in the waveguide for the laser.

In FIG. 6D, an infrared laser 72 is temperature controlled by the thermoelectric cooler 74 and has an output 76 which is butt-coupled to nonlinear element 78 mounted on the thermoelectric cooler element 80. A plurality of gratings 82 above a waveguide region of the nonlinear device 78 provide feedback to laser 72 in the same manner as the gratings of a DBR or DFB laser, except now the gratings are external to the laser. Domains 84 have alternating dominant polarizations, thereby forming a periodically-poled frequency-doubling QPM waveguide.

Figure 7:
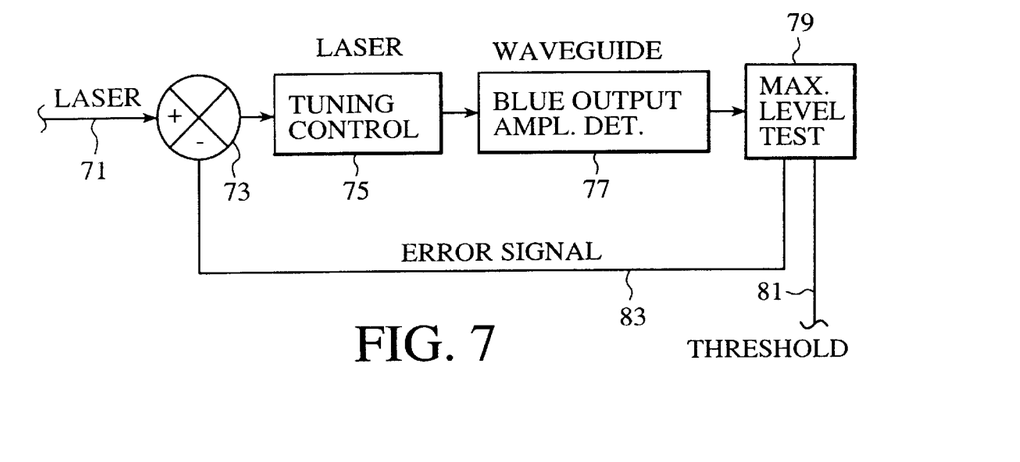
FIG. 7 is an electrical block diagram of a servo system for automatically tuning a laser of the type shown in FIG. 1.

With reference to FIG. 7, an electronic tuning mechanism for a blue laser is shown. An initial command for a particular frequency is established by calibration or otherwise. An electrical signal representing this command is input along line 71 to summing junction 73 and forwarded to a tuning control 75 for the diode laser. The tuning control may be a thermoelectric cooler or heater which tunes the laser and waveguide in the manner previously described. The output of the laser is doubled in the waveguide and the waveguide output, mainly blue light, is sampled in the amplitude detector 77 which may be a photodetector having filters for eliminating any light of the fundamental wavelength. A threshold may be set in a test circuit 79 on line 81. The test circuit may be a comparator which produces an error signal on line 83 when the signal from detector 77 falls below the threshold level on line 81, representing a maximum output level. This error signal is fed back to the summing junction 73, where the input frequency command is modified until the tuning control 75 tunes the laser so that a maximum level is produced. The laser output need not be adjusted automatically using the servo system, but may be tested at the time of construction and preset.

Laser devices in accord with the present invention are very compact, with overall dimensions approximating 1 cm in length, making the devices suitable for a wide variety of applications, including consumer electronics and industrial applications.

Although thermoelectric coolers (TEC) are shown in the drawings for thermal stability and tuning purposes, heaters can also be used to achieve the desired temperature. Accordingly, TECs are intended to encompass heaters, as well as coolers.

Figure 8A:
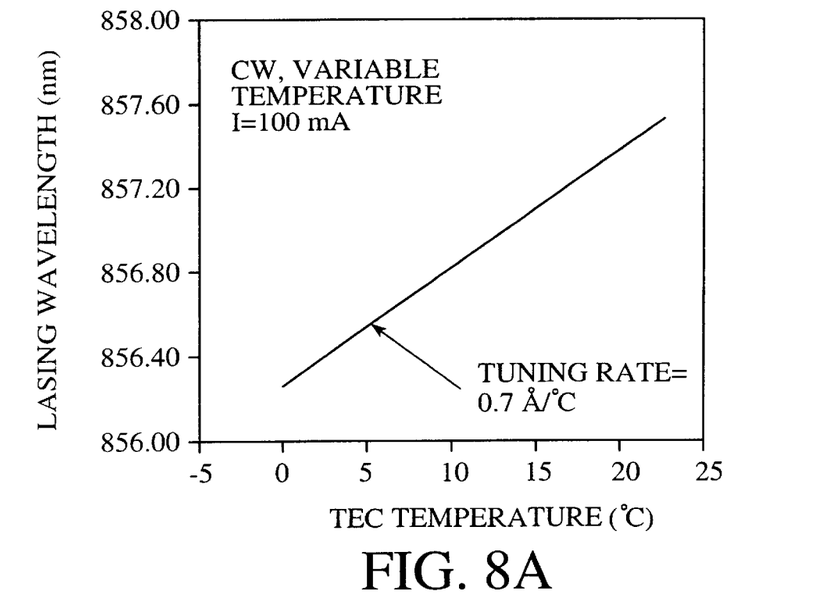
FIGS. 8A and 8B are plots showing wavelength tuning of a device of the present invention by changes in temperature or current.

With reference to FIG. 8A, the tunability of a laser of the types described herein is shown with reference to specific TEC temperatures in degrees centigrade. The tuning rate is approximately 0.7 Å/° C. for a cw laser with an input current of 100 mA. Tuning is over a range of from 0° C. to 23° C. and is linear with respect to wavelength.

Figure 8B:
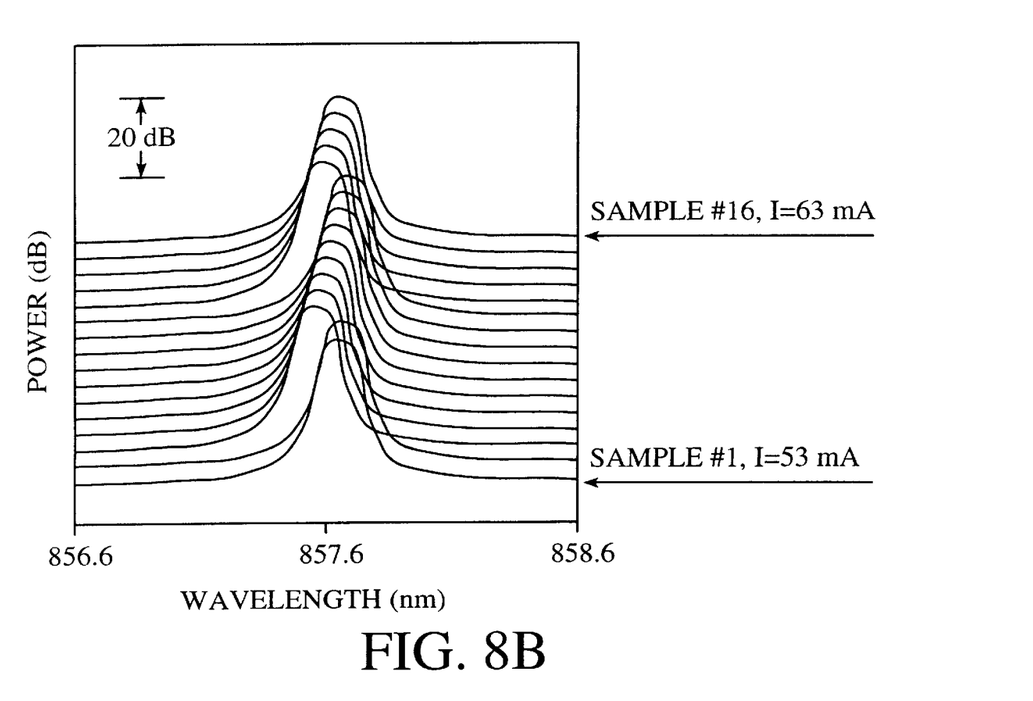

The same laser may be tuned, as described above, with changes in the tuning current, as shown in FIG. 8B. Current tuning provides fine wavelength control, with notable tuning peaks separated by a few Angstroms, with current changes of only a few milliamps, while temperature change provides a greater, but coarser mode of control. As previously described, both modes may be used together. This allows accurate and independent tuning of the resonant frequencies of the laser and waveguide, at different rates, so that resonant frequencies of each can be phase matched for efficient frequency multiplication, i.e. conversion to a desired wavelength.

What is claimed is:

1. A frequency converting light emitting device comprising,
a semiconductor laser emitting a light beam of a first wavelength,
a nonlinear frequency converting material optically coupled to said laser to receive said light beam, said nonlinear converting material oriented for carrying out frequency conversion of said light beam received from said laser, said nonlinear frequency converting material having a temperature dependent resonance wavelength band for converting light of said first wavelength that coincides with said resonance wavelength band to a second wavelength;
temperature control means in thermal communication with said nonlinear frequency converting material for setting a temperature of said nonlinear frequency converting material to correspond to a selected resonance wavelength band including said second wavelength;
means for coarse tuning said laser such that said first wavelength of said light beam emitted by said laser coincides with said selected resonance wavelength band of said nonlinear frequency converting material for converting to said second wavelength;
said temperature control means for fine tuning said second wavelength after coarse tuning of said first wavelength.

2. The frequency converting light emitting device of claim 1 further comprising said means in thermal communication with said laser for wavelength tuning said laser via adjustment to its operational temperature.

3. The frequency converting light emitting device of claim 1 wherein said laser includes resonant optical cavity, a reflector in said cavity for providing optical feedback at said first wavelength.

4. The frequency converting light emitting device of claim 1 wherein said means for tuning said first wavelength includes current injection means for applying a tuning current to said laser.

5. The frequency converting light emitting device of claim 4 wherein said laser includes a grating region capable of variable refractive index, said tuning current applied to said grating region.

6. The frequency converting light emitting device of claim 4 wherein said laser includes modulation means for modulating said light beam.

7. The frequency converting light emitting device of claim 1 wherein said laser tuning means comprises means for applying a tuning current to a region of said laser proximate to said reflector.

8. The frequency converting light emitting device of claim 1 wherein said nonlinear material includes a quasi-phase-matched waveguide.

9. The frequency converting light emitting device of claim 1 further defined by servo means for matching the wavelength of said laser to the resonance condition of said nonlinear frequency converting material.

10. The frequency converting light emitting device of claim 1 further comprising a fiber amplifier having an input optically coupled to receive and amplify said semiconductor laser light beam and having an output comprising the amplified laser light beam optically coupled as an input to said nonlinear frequency converting material.

11. The frequency converting light emitting device of claim 10 wherein said fiber amplifier comprises a double clad fiber with a central core doped with an active light amplifying element.

12. The frequency converting light emitting device of claim 1 wherein said laser is a DBR laser and said reflector is a DBR grating.

13. The frequency converting light emitting device of claim 1 wherein a planar extent of said laser is substantially orthogonal relative to said nonlinear frequency converting material.

14. The frequency converting light emitting device of claim 1 wherein said laser and said nonlinear frequency converting material are optically butt coupled.

15. The frequency converting light emitting device of claim 1 wherein said temperature control means is a thermoelectric cooler.

16. The frequency converting light emitting device of claim 1 wherein said temperature control means is a heater.

17. A laser device comprising:
a laser oscillator having a first frequency;
a nonlinear optical waveguide for converting the laser first frequency to a second frequency, the waveguide having means for selectively tuning the second frequency;
means to optically couple said laser oscillator to said waveguide;
thermal applying means for tuning the first frequency; and
means for tuning the second frequency in conjunction with tuning the first frequency so that said first and second frequencies are phase matched for efficient frequency conversion.

18. The laser device of claim 1 wherein said second frequency tuning means comprises a thermoelectric cooler, a heater, or an annealing process and said first frequency tuning means comprises a thermoelectric cooler or a heater.

19. A laser device comprising:
a laser oscillator having a first frequency, the laser oscillator having first means for selectively tuning the first frequency;
a nonlinear optical waveguide for converting the laser frequency to a second frequency, the waveguide having second means for selectively tuning the second frequency;
means to optically couple said laser oscillator to said waveguide;
said first and second means for independently tuning the first and second frequencies so that said first and second frequencies are phase matched for efficient frequency conversion of said first frequency to said second frequency.

20. The laser device of claim 19 further comprising means for tuning the first frequency after tuning the second frequency so that said first and second resonant frequencies are phase matched for efficient frequency conversion.

21. The laser device of claim 20 wherein said first frequency tuning means comprises a thermoelectric cooler or a heater and said second frequency tuning means comprises a thermoelectric cooler, a heater, or an annealing process.

22. The laser device of claim 19 further comprising a grating for selecting the first wavelength of said laser oscillator.

23. A method of tuning a system comprising a laser having an output of a first frequency optically coupled to a frequency converting waveguide for converting the laser first frequency to a second frequency provided at its output, comprising the steps of:

operating the laser to provide a light beam into the frequency converting waveguide;

annealing the frequency converting waveguide while monitoring the resonant wavelength of the same;

terminating annealing after the first resonant frequency coincides with the resonance wavelength band of the frequency converting waveguide including the second frequency; and tuning the laser to maintain its output substantially the same as the first frequency so that conversion to the second frequency is maintained.

24. The method of claim 23 wherein the step of tuning the laser comprises the step of adjusting the temperature of the laser.

25. The method of claim 24 wherein the step of tuning the laser comprises employment of a thermoelectric cooler.

26. The method of claim 24 wherein the step of tuning the laser comprises employment of a heater.

27. The method of claim 23 wherein the step of tuning the laser comprises the step of applying a tuning current to the laser.

28. The method of claim 23 further comprising the step of providing a wavelength reflector in the laser for providing feedback to maintain its operation substantially at the first frequency, the step of tuning the laser comprises the step of heating a region of the laser at or in proximity to the reflector.

29. The method of claim 23 further comprising the step of providing a wavelength reflector in the laser for providing feedback to maintain its operation substantially at the first frequency, the step of tuning the laser comprises the step of applying a tuning current to a region of the laser at or in proximity to the reflector.

30. A frequency converting light emitting device comprising, a semiconductor laser having means for selecting a lasing wavelength;

a nonlinear frequency doubler operating at a wavelength within a range of wavelengths;

means for tuning said nonlinear frequency doubler to a conversion frequency within said wavelength range;

means for optically coupling the nonlinear frequency doubler with the laser;

said selecting means selective of a lasing wavelength and said tuning means selective of a conversion wavelength independently adjusted to provide for optimum conversion efficiency of said lasing wavelength to said conversion wavelength.

31. The laser device of claim 30 wherein said doubler nonlinear frequency material includes a waveguide therein.

32. The laser device of claim 30 wherein said selecting means is a grating in said laser.

33. The laser device of claim 30 wherein said laser is tunable via said selecting means over a range of wavelengths.

34. The laser device of claim 33 wherein said selecting means is a grating in said laser.

35. The laser device of claim 30 wherein said nonlinear frequency doubler includes means for tuning over a range of wavelengths.

36. The laser device of claim 30 wherein said nonlinear frequency doubler and said laser are independently tunable over a range of wavelengths.

37. The laser device of claim 30 wherein said selecting means in said laser is a DBR or a DFB structure.

38. The laser device of claim 37 wherein said selecting means in said laser further comprises means for applying a tuning source to said laser.

39. The laser device of claim 30 wherein said selecting means in said laser and said tuning means in said nonlinear frequency doubler comprises at least one thermoelectric cooler or at least one heater.

40. The laser device of claim 30 further comprising a temperature controlling means for said nonlinear frequency doubler.

41. The laser device of claim 40 wherein said temperature controlling means comprises a thermo electric cooler or a heater.

42. The laser device of claim 30 wherein said selecting means in said laser and said tuning means in said nonlinear frequency doubler comprises one independently controlled thermoelectric cooler or heater for each of said laser and said nonlinear frequency doubler.

* * * * *